US012656413B2

(12) United States Patent
Yang et al.

(10) Patent No.: US 12,656,413 B2
(45) Date of Patent: Jun. 16, 2026

(54) SAFETY MECHANISM CIRCUIT AND MOTHERBOARD

(71) Applicant: Quanta Computer Inc., Taoyuan City (TW)

(72) Inventors: Chih-Wei Yang, Taoyuan City (TW); Chin-Yu Liu, Taoyuan City (TW); Ming Hong Ni, Taoyuan City (TW); Kung-Chang Chuang, Taoyuan City (TW)

(73) Assignee: QUANTA COMPUTER INC., Taoyuan City (TW)

( * ) Notice: Subject to any disclaimer, the term of this patent is extended or adjusted under 35 U.S.C. 154(b) by 28 days.

(21) Appl. No.: 19/001,152

(22) Filed: Dec. 24, 2024

(65) Prior Publication Data

US 2026/0072103 A1 Mar. 12, 2026

(30) Foreign Application Priority Data

Sep. 10, 2024 (TW) ................................. 113134223

(51) Int. Cl.
| | |
|---|---|
| *G06F 11/00* | (2006.01) |
| *G01R 19/00* | (2006.01) |
| *G01R 31/69* | (2020.01) |
| *G06F 1/30* | (2006.01) |
| *G06F 11/22* | (2006.01) |

(52) U.S. Cl.
CPC ......... *G01R 31/69* (2020.01); *G01R 19/0084* (2013.01); *G06F 1/30* (2013.01); *G06F 11/2284* (2013.01)

(58) Field of Classification Search
CPC ....... G01R 31/69; G01R 19/0084; G06F 1/30; G06F 11/2284
See application file for complete search history.

(56) References Cited

U.S. PATENT DOCUMENTS

| | | | |
|---|---|---|---|
| 6,339,831 B1* | 1/2002 | Sugawara | ........... G06F 13/4077 710/9 |
| 2016/0033566 A1* | 2/2016 | Shiu | ....................... H02H 3/087 361/87 |
| 2016/0377668 A1* | 12/2016 | Ghannam | .......... H01R 13/5216 439/587 |
| 2017/0288348 A1* | 10/2017 | Pohl | ....................... G01R 31/69 |

* cited by examiner

*Primary Examiner* — Jason B Bryan
(74) *Attorney, Agent, or Firm* — McClure, Qualey & Rodack, LLP

(57) ABSTRACT

A safety mechanism circuit is provided. The safety mechanism circuit is disposed on a motherboard which includes a connector to be connected to a function circuit. In response to the function circuit being coupled to the connector, a detection circuit detects the voltage level of a contact terminal. In response to the voltage level of the contact terminal not being equal to a predetermined level, an operating circuit enters a safety mode to perform a safety operation. In response to the voltage level of the contact terminal being equal to the predetermined level, the operating circuit enters a normal mode to stop performing the safety operation.

20 Claims, 3 Drawing Sheets

SAFETY MECHANISM CIRCUIT AND MOTHERBOARD

CROSS REFERENCE TO RELATED APPLICATIONS

This Application claims priority of Taiwan Patent Application No. 113134223, filed on Sep. 10, 2024, the entirety of which is incorporated by reference herein.

BACKGROUND OF THE INVENTION

Field of the Invention

The present invention relates to a safety mechanism circuit, and, in particular, to a safety mechanism circuit that automatically diagnoses the state of a connector.

Description of the Related Art

After a connector is connected to an external device, the connector can receive signals from the external device and provide these signals to a processor. However, when the connection between the external device and the connector is unstable due to vibration or poor assembly, the connector will be unable to receive signals from the external device, or it will send the wrong signals to the processor, causing processor to malfunction. The processor may mistakenly believe that the external device is faulty.

BRIEF SUMMARY OF THE INVENTION

In accordance with an embodiment of the disclosure, a safety mechanism circuit is disposed on a motherboard which comprises a connector to be connected to a function circuit. The safety mechanism circuit comprises a detection circuit, a control circuit, and an operating circuit. The detection circuit is coupled between a contact terminal of the connector and a specific node. The control circuit sets a voltage level of the specific node so that the voltage level of the specific node is equal to a set level in response to the function circuit being coupled to the connector and a specific function is activated. The operating circuit operates in a normal mode or a safety mode according to the voltage level of the specific node. In response to the function circuit being coupled to the connector, the function circuit is electrically connected to the contact terminal, the detection circuit detects the voltage level of the contact terminal. In response to the voltage level of the contact terminal not being equal to a predetermined level, the detection circuit sets the voltage level of the specific node so that the voltage level of the specific node is not equal to the set level, and the operating circuit enters the safety mode to perform a safety operation. In response to the voltage level of the contact terminal being equal to the predetermined level, the operating circuit enters the normal mode to stop performing the safety operation.

In accordance with another embodiment of the disclosure, a motherboard comprises a connector and a safety mechanism circuit. The connector is coupled to a function circuit and comprises a first transmission terminal, a second transmission terminal, and a plurality of third transmission terminals. The first transmission terminal is electrically connected to the function circuit and a first contact terminal. The second transmission terminal is electrically connected to the function circuit and a second contact terminal. The third transmission terminals are disposed between the first and second transmission terminals. The safety mechanism circuit determines whether a connection between the function circuit and the connector is unstable and comprises a detection circuit, a control circuit, and an operating circuit. The detection circuit is coupled between the first contact terminal, the second contact terminal and a specific node. The control circuit sets a voltage level of the specific node so that the voltage level of the specific node is equal to a set level in response to the function circuit being coupled to the connector and a specific function is activated. The operating circuit operates in a normal mode or a safety mode according to the voltage level of the specific node. In response to the function circuit being coupled to the connector, the function circuit is electrically connected to the first and second contact terminals, and the detection circuit detects the voltage levels of the first and second contact terminals. In response to the voltage level of the first or second contact terminal not being equal to a first predetermined level, the detection circuit sets the voltage level of the specific node so that the voltage level of the specific node is not equal to the set level, and the operating circuit performs a safety operation. In response to the voltage levels of the first and second contact terminals being equal to the first predetermined level, the operating circuit stops performing the safety operation.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

Figure 1A:
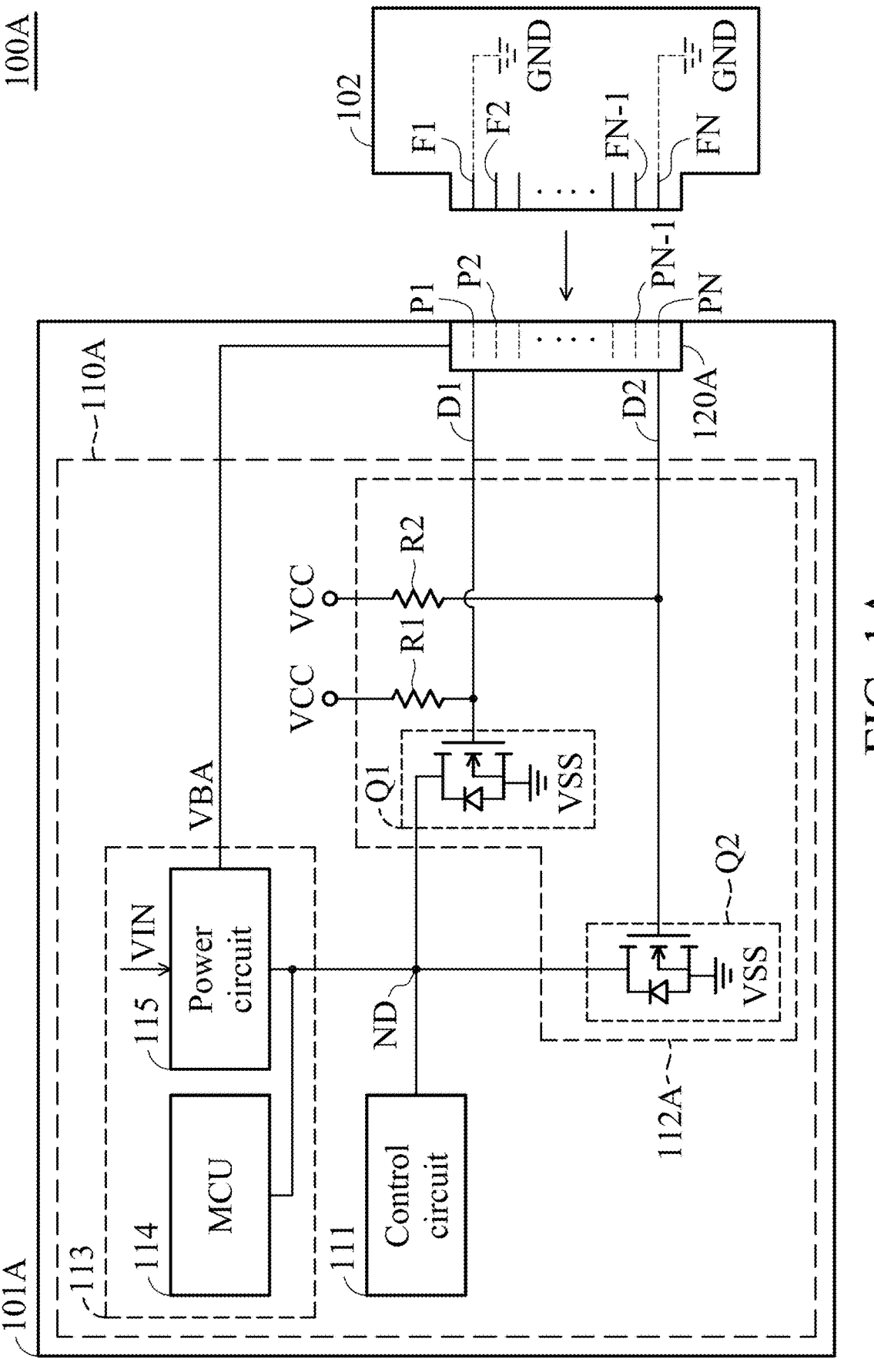
FIG. 1A is a schematic diagram of an exemplary embodiment of a control system according to various aspects of the present disclosure.

The present invention will be described with respect to particular embodiments and with reference to certain drawings, but the invention is not limited thereto and is only limited by the claims. The drawings described are only schematic and are non-limiting. In the drawings, the size of some of the elements may be exaggerated for illustrative purposes and not drawn to scale. The dimensions and the relative dimensions do not correspond to actual dimensions in the practice of the invention.

FIG. 1A is a schematic diagram of an exemplary embodiment of a control system according to various aspects of the present disclosure. The control system 100A comprises a motherboard (MB) 101A and a daughter board (DB) 102. The kind of DB 102 is not limited in the present disclosure. In one embodiment, the DB 102 is a function circuit, such as an advanced driver assistance system (ADAS), an in-vehicle infotainment (IVI) system, or a vehicle control unit (VCU).

In this embodiment, the DB 102 comprises transmission terminals F1~FN to transmit signals to the MB 101A or receive the signals from the MB 101A. The transmission terminals F1~FN are arranged successively. In one embodiment, at least one of the transmission terminals F1~FN is coupled to a ground terminal GND. For example, the transmission terminals F1 and FN are coupled to the ground terminal GND. In this embodiment, each of the transmission terminals F1~FN has a golden finger shape, but the disclosure is not limited thereto. The shapes of the transmission terminals F1~FN are not limited in the present disclosure. As long as the transmission terminals F1~FN can transmit signals, the transmission terminals F1~FN can be of any shape. In one embodiment, the shapes of the transmission terminals F1~FN are round. Additionally, the shape of one of the transmission terminals F1~FN is different from the shape of another of the transmission terminals F1~FN.

The MB 101A comprises a safety mechanism circuit 110A and a connector 120A. The connector 120A is coupled to the DB 102. In one embodiment, the connector 120A comprises a plurality of transmission terminals P1~PN and a contact terminal D1. The transmission terminals P1~PN are arranged successively. The contact terminal D1 is electrically connected to one of the transmission terminals P1~PN. In this embodiment, the contact terminal D1 is electrically connected to the transmission terminal P1 (or referred to as a first transmission terminal). When the DB 102 is connected to the connector 120A, the transmission terminals F1~FN are electrically contacted to the transmission terminals P1~PN, respectively. As shown in FIG. 1A, each of the transmission terminals P1~PN has a golden finger shape, but the disclosure is not limited thereto. The shapes of the transmission terminals P1~PN are not limited in the present disclosure. As long as the transmission terminals P1~PN can transmit signals, voltages, and currents, the transmission terminals P1~PN can be of any shape. In one embodiment, the shapes of the transmission terminals P1~PN are round.

In this embodiment, the shapes of the transmission terminals P1~PN are the same as the shapes of the transmission terminals F1~FN, but the disclosure is not limited thereto. As long as the DB 102 is connected to the connector 120A, the transmission terminals P1~PN can contact the transmission terminals F1~FN, and the shapes of the transmission terminals P1~PN may be different from the shapes of the transmission terminals F1~FN. Additionally, one of the shapes of the transmission terminals P1~PN may be different from another of the shapes of the transmission terminals P1~PN.

The safety mechanism circuit 110A determines whether the connector 120A is capable of transmitting signals normally and whether the DB 102 is out of the connector 120A. For example, when the DB 102 is poorly assembled or is exposed to extreme environments such as high and low temperatures and high humidity, it may be detached from the connector 120A, or the connection between the DB 102 and the connector 120A may be unstable. In this case, the connector 120A will not be able to normally transmit signals from the DB 102 to the safety mechanism circuit 110A or transmit signals from the safety mechanism circuit 110A to the DB 102. Furthermore, when the connector 120A is poorly produced or designed, the amount of solder may be insufficient, resulting in cracks and making the connector 120A unable to transmit signals normally. In this embodiment, when the safety mechanism circuit 110A detects an abnormality (such as a fault in the connector 120A or the DB 102 is detached), a safety operation is performed to prevent the control system 100A from operating abnormally.

The structure of the MB 101A is not limited in the present disclosure. In other embodiments, the MB 101A further comprises an Ethernet switch, at least one PCIe switch, and at least one communication interface. The communication interface may comprise a controller area network (CAN), a local interconnect network (LIN), or an in-vehicle Ethernet which matches 100 BASE-TI transmission protocol or 1000 BASE-TI transmission protocol.

In this embodiment, the safety mechanism circuit 110A comprises a control circuit 111, a detection circuit 112A and an operating circuit 113. The control circuit 111 is configured to set the voltage level of a specific node ND. In one embodiment, when the DB 102 is connected to the connector 120A and a specific function is activated, the control circuit 111 sets the voltage level of the specific node ND so that the voltage level of the specific node ND is equal to a set level, such as a high level. In some embodiments, the control circuit 111 detects the voltage level of at least one of the transmission terminals P1~PN to determine whether the DB 102 is connected to the connector 120A.

The detection circuit 112A is coupled between the contact terminal D1 and the specific node ND. The detection circuit 112A determines whether an abnormality (such as a failure of the connector 120A or an abnormality in the connection between the DB 102 and the connector 120A) occurs according to the voltage level of the contact terminal D1. The detection circuit 112A sets the voltage level of the specific node ND according to the determination result.

For example, when the voltage level of the contact terminal D1 is not equal to a first predetermined level, it indicates that an abnormality occurs. Therefore, the detection circuit 112A sets the specific node ND so that the voltage level of the specific node ND is not equal to a set level. At this time, the detection circuit 112A may set the voltage level of the specific node ND so that the voltage level of the specific node ND is equal to a low level. However, when the voltage level of the contact terminal D1 is equal to the first predetermined level, it indicates that no abnormality has occurred. Therefore, the detection circuit 112A does not set the voltage level of the specific node ND. At this time, the voltage level of the specific node ND may be equal to a set level, such as a high level.

The structure of the detection circuit 112A is not limited in the present disclosure. Any circuit can serve as the detection circuit 112A, as long as the circuit is capable of setting the voltage level of the specific node ND according to the voltage level of the contact terminal D1. In this embodiment, the detection circuit 112A comprises a transistor Q1 and a resistor R1. The gate of the transistor Q1 is coupled to the contact terminal D1. The drain of the transistor Q1 is coupled to the specific node ND. The source of the transistor Q1 receives an operation voltage VSS. The resistor R1 receives an operation voltage VCC. In one embodiment, the operation voltage VCC is higher than the operation voltage VSS.

When the DB 102 is normally connected to the connector 120A, the voltage of the contact terminal D1 is equal to the voltage of the ground terminal GND, such as 0V. Therefore, transistor Q1 is turned off. However, when the connection between the DB 102 and the connector 120A is unstable, or when the connector 120A fails, the voltage of the contact terminal D1 is not equal to the voltage of the ground terminal GND. At this time, since the gate voltage of the transistor Q1 is about equal to the operation voltage VCC, the transistor Q1 is turned on. Therefore, the voltage level of the specific node ND is equal to the operation voltage VSS.

In other embodiments, the detection circuit 112A further detects the voltage level of a contact terminal D2 of the connector 120A. The contact terminal D2 is electrically connected to the transmission terminal PN. In this case, when the DB 102 is inserted into the connector 120A, since the transmission terminals F1 and FN are coupled to the ground terminal GND, the voltage levels of the contact terminals D1 and D2 are equal to the voltage level of the ground terminal GND. However, when the voltage level of the contact terminal D2 is not equal to the voltage level of the ground terminal GND (or referred to as a first predetermined level), it means that the connection between the DB 102 and the connector 120A is unstable or the connector 120A is damaged. Therefore, the detection circuit 112A sets the voltage level of the specific node ND so that the voltage level of the specific node ND is not equal to a set level.

In some embodiments, the detection circuit 112A further comprises a transistor Q2 and a resistor R2. The gate of the transistor Q2 is coupled to the contact terminal D2. The drain of the transistor Q2 is coupled to the specific node ND. The source of the transistor Q2 receives the operation voltage VSS. The resistor R2 receives the operation voltage VCC. When the connection between the DB 102 and the connector 120A is stable, the voltage level of the contact terminal D2 is equal to the first predetermined level, such as the voltage level of the ground terminal GND. Therefore, the transistor Q2 is turned off. However, when the DB 102 is not completely connected to the connector 120A or the connector 120A is damaged, the voltage level of the contact terminal D2 is not equal to the first predetermined level. Therefore, the gate voltage of the transistor Q2 is equal to the operation voltage VCC so that the transistor Q2 is turned on and the voltage level of the specific node ND is equal to the operation voltage VSS.

In one embodiment, the contact terminals D1 and D2 are respectively located on both sides of the connector 120A to detect incomplete disengagement. For example, when the voltage of the contact terminal D1 is not equal to the voltage of the ground terminal GND and the voltage of the contact terminal D2 is equal to the voltage of the ground terminal GND, it means that one side of the DB 102 is separated from the connector 120A, so that the transmission terminal P1 does not contact the transmission terminal F1. Therefore, the detection circuit 112A sets the voltage level of the specific node ND so that the voltage level of the specific node ND is not equal to a set level. In one embodiment, the transmission terminals P2~PN-1 (or referred to as third transmission terminals) of the connector 120A are located between the transmission terminals P1 and PN.

Since the detection circuit 112A instantly diagnoses the connection between the DB 102 and the connector 120A, when the DB 102 is completely detached from the connector 120A or partially detached from both sides of the connector 120A, the detection circuit 112A can react immediately (e.g., to change the voltage level of the specific node ND) according to the voltage level of the contact terminals D1 and D2. In some embodiments, the detection circuit 112A may determine that the connection between the DB 102 and the connector 120A is unstable within 7.4 us.

The operating circuit 113 operates in a normal mode or a safety mode according to the voltage level of the specific node ND. For example, when the voltage level of the specific node ND is equal to a set level, it indicates that the connection between the DB 102 and the connector 120A is stable. Therefore, the operating circuit 113 enters a normal mode. In the normal mode, the operating circuit 113 operates according to the signal from the DB 102. At this time, the signal from the DB 102 may affect the operation of the control circuit 111, such as affecting the output of the control circuit 111.

However, when the voltage level of the specific node ND is not equal to a set level, it indicates that the connection between the DB 102 and the connector 120A is unstable, such as the DB 102 suddenly falling off or the connector 120A failing. Therefore, the operating circuit 113 enters a safety mode. In the safety mode, the operating circuit 113 performs a safety operation to avoid abnormal operation of the control system 100A.

For example, assuming that the control system 100A is a self-driving system. In this case, when the DB 102 suddenly falls off or the connector 120A fails, the control circuit 111 and the operating circuit 113 cannot receive signals from the DB 102 and cannot transmit control signal to the DB 102. Therefore, the operating circuit 113 directs the control system 100A to enter an emergency state. In the emergency state, the control system 100A may reduce the vehicle speed, sound a warning sound, or display a warning image to notify the driver of an abnormal event. In another embodiment, operating circuit 113 may direct the control circuit 111 to stop using signals from connector 120A.

In one embodiment, the operating circuit 113 comprises a power circuit 115. The power circuit 115 operates in a normal mode or a safety mode according to the voltage level of the specific node ND. For example, when the connection between the DB 102 and the connector 120A is stable, the voltage level of the specific node ND is equal to a set level. Therefore, the power circuit 115 enters a normal mode. In the normal mode, the power circuit 115 provides power VBA to the connector 120A. In one embodiment, the power circuit 115 receives an input voltage VIN and serves the input voltage VIN as the power VBA. When the connection between the DB 102 and the connector 120A is unstable or the connector 120A is damaged, the voltage level of the specific node ND is not equal to the set level. Therefore, the power circuit 115 enters a safety mode. In the safety mode, the power circuit 115 stops providing the power VBA to the connector 120A.

In some embodiments, when an abnormal situation occurs, the power circuit 115 suspends supplying the power VBA. For example, when the input voltage VIN exceeds an upper-limit value or is lower than a lower-limit value, or a specific current exceeds a predetermined range, the power circuit 115 stops providing the power VBA.

In other embodiments, the operating circuit 113 comprises a micro-controller (MCU) 114. The MCU 114 operates in a normal mode or a safety mode according to the voltage level of the specific node ND. For example, when the voltage level of the specific node ND is equal to a set level, the MCU 114 enters a normal mode. In the normal mode, the MCU 114 uses the signals from the DB 102 or outputs signals to the DB 102. When the voltage level of the specific node ND is not equal to the set level, it means that the connection between the DB 102 and the connector 120A is unstable or the connector 120A is damaged. Therefore, the MCU 114 enters a safety mode. In the safety mode, the MCU 114 may direct the control system 100A to enter an emergency state. In the emergency state, the control system 100A may reduce the vehicle speed or stop using the signals from the DB 102. In other embodiments, the control system 100A comprises other devices to control the vehicle speed or display warning information.

Figure 1B:
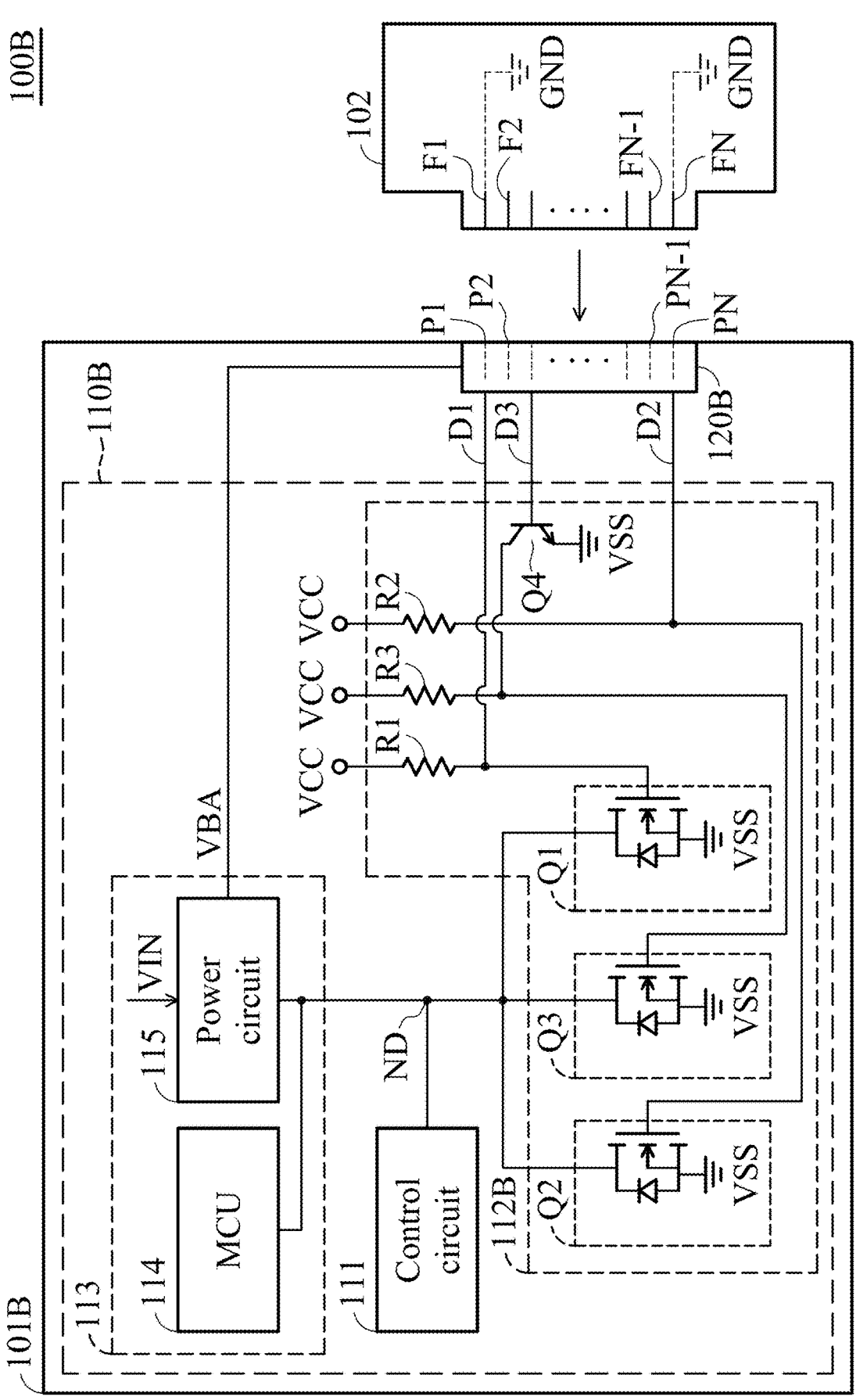
FIG. 1B is a schematic diagram of another exemplary embodiment of the control system according to various aspects of the present disclosure.

FIG. 1B is a schematic diagram of another exemplary embodiment of the control system according to various aspects of the present disclosure. The control system 100B shown in FIG. 1B is similar to the control system 100A shown in FIG. 1A with the exception that the connector 120B further comprises a contact terminal D3. The contact terminal D3 is electrically connected to one of the transmission terminals P2~PN−1. In this embodiment, the detection circuit 112B determines whether the connection between the DB 102 and the connector 120B is stable according to the voltage level of the contact terminal D3. For example, when the voltage level of the contact terminal D3 is not within a predetermined range, or the voltage level of the contact terminal D3 is not equal to a second predetermined level, it indicates that the DB 102 or the connector 120B is abnormal. Therefore, the detection circuit 112B sets the voltage level of the specific node ND so that the voltage level of the specific node ND is not equal to a set level. Therefore, the operating circuit 113 enters a safety mode. However, when the voltage level of the contact terminal D3 is within a predetermined range or the voltage level of the contact terminal D3 is equal to a second predetermined level, it indicates that the DB 102 and the connector 120B operates normally. Therefore, the detection circuit 112B does not change the voltage level of the specific node ND.

In this embodiment, the detection circuit 112B further comprises a transistor Q4 and a resistor R3. The type of the transistor Q3 is the same as the type of the transistor Q1 or Q2, but different from the type of the transistor Q4. In one embodiment, the transistor Q4 is a bipolar junction transistor (BJT), and the transistors Q1~Q3 are metal-oxide-semiconductor (MOS) transistors, but the disclosure is not limited thereto. In other embodiments, the transistors Q1~Q4 can be replaced by other electronic devices. For example, the transistor Q4 may be replaced by a comparator to determine whether the voltage level of the contact terminal D3 is equal to a second predetermined level.

As shown in FIG. 1B, the gate of the transistor Q3 is coupled to the resistor R3 and the collector of the transistor Q4. The drain of the transistor Q3 is coupled to the specific node ND. The source of the transistor Q3 receives the operation voltage VSS. The base of the transistor Q4 is coupled to the contact terminal D3. The collector of the transistor Q4 is coupled to the gate of the transistor Q3. The emitter of the transistor Q4 receives the operation voltage VSS. The resistor R3 receives the operation voltage VCC.

When the voltage level of the contact terminal D3 is normal (e.g., within a specific range, such as 12V~0.6V), the transistor Q4 is turned on. Therefore, the transistor Q3 is turned off. At this time, if the transistors Q1 and Q2 are turned off, the control circuit 111 controls the voltage level of the specific node ND. However, when the voltage level of the contact terminal D3 is abnormal (e.g., within an abnormal range, such as 0~0.6V), the transistor Q4 is turned off. Since the resistor R3 receives the operating voltage VCC, the transistor Q3 is turned on. Therefore, the voltage level of the specific node ND is not equal to a set level. At this time, the voltage level of the specific node ND may be equal to the operating voltage VSS.

The number of connectors on the MB 101B is not limited in the present disclosure. In other embodiments, the MB 101B has more connectors for connecting more DBs. When different DBs are inserted into the connectors of the MB 101B, the MB 101B operates according to the signals provided by the DBs and controls the operations of the DBs, thus achieving expandable and replaceable functions. In this case, the MB 101B has more detection circuits. Each detection circuit detects the corresponding connector to detect whether the connection between the DB and the connector is stable and whether the connector is faulty.

Furthermore, the number of contact terminals is not limited in the present disclosure. In other embodiments, the detection circuit 112B may detect voltage levels of more contact terminals to determine whether the corresponding connector and the corresponding DB work normally. When the connector fails or the DB falls off, the control system 100B enters an emergency state to prevent accidents and greatly improve safety.

Figure 2:
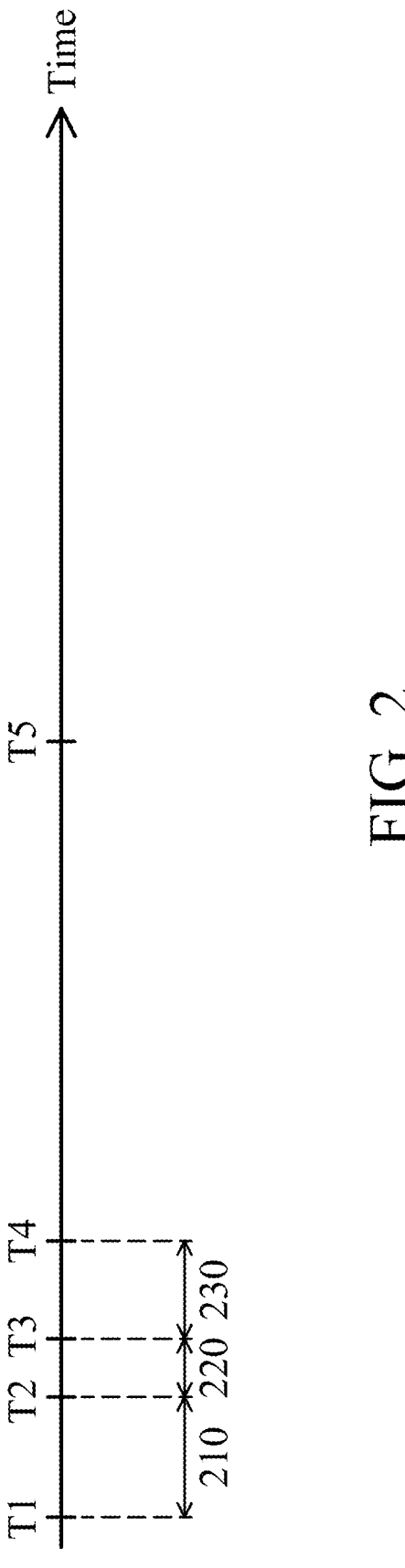
FIG. 2 is an operation schematic diagram of an exemplary embodiment of a safety mechanism circuit according to various aspects of the present disclosure.

FIG. 2 is an operation schematic diagram of an exemplary embodiment of a safety mechanism circuit according to various aspects of the present disclosure. For brevity, the control system 100A is given as an example. Assume that the control system 100A is applied in a self-driving car. In an operation period 210, the self-driving car works. However, the DB 102 may fall off or partially fall off causing the DB 102 to be unable to connect to the connector 120A due to vibration during driving or poor assembly between the DB 102 and the connector 120A. In addition, due to poor production or design, the amount of solder in the connector 120A may be insufficient, resulting in cracks, causing the connector 120A to be unable to transmit signals from the MB 101A to the DB 102, or to abnormally transmit the signals from the DB 102 to the MB 101A. Therefore, during the operation period 210, the connector 120A may fail or the DB 102 may detach from the connector 120A.

When the connector 120A fails or the DB 102 is detached, the voltage level of the contact terminal D1 is not equal to a predetermined level. Since the detection circuit 112A continuously detects the voltage level of the contact terminal D1, during a diagnosis period 220, once the detection circuit 112A finds that the voltage level of the contact terminal D1 is not equal to a predetermined level, it immediately sets the voltage level of the specific node ND so that the voltage level of the specific node ND is not equal to a set level.

During the reaction period 230, the operating circuit 113 determines that the connector 120A cannot normally transmit the signal of the DB 102 according to the voltage level of the specific node ND. In this period, the DB 102 may be detached or the connector 120A may be faulty. Therefore, at time point T4, the operating circuit 113 performs a safety operation, such as reducing the vehicle speed, and notifies the driver. When the driver receives the notification, the driver may immediately find for a suitable place to park.

At time point T5, the driver stops the vehicle and puts the vehicle in a safe state. In the safe state, the driver notifies the repair shop, and the repair shop re-installs the DB 102 so that the DB 102 is correctly connected to the connector 120A. When the detection circuit 112A determines that the connection between the DB 102 and the connector 120A is stable according to the voltage level of the contact terminal D1, the detection circuit 112A stops setting the voltage level of the specific node ND to unequal to a set level. At this time, the control circuit 111 may set the voltage level of the specific node ND to a set level. Therefore, the operating circuit 113 enters a normal mode and notifies the driver that all functions of the vehicle are normal.

Since the detection circuit 112A continuously detects the voltage level of the contact terminal D1, when the voltage level of the contact terminal D1 is abnormal, the detection circuit 112A immediately sets the voltage level of the specific node ND. Therefore, the operating circuit 113 can immediately perform safety operation, greatly improving the safety of the control system 100A and avoiding accidents such as collision or loss of control of the self-driving car.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein. It will be understood that although the terms "first," "second," etc. may be used herein to describe various elements, these elements should not be limited by these terms. These terms are only used to distinguish one element from another. In the following claims, the terms "first," "second," etc. are used merely as labels, and are not intended to impose numerical requirements on their objects.

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A safety mechanism circuit disposed on a motherboard which comprises a connector to be connected to a function circuit, comprising:

a detection circuit coupled between a first contact terminal of the connector and a specific node;

a control circuit setting a voltage level of the specific node so that the voltage level of the specific node is equal to a set level in response to the function circuit being coupled to the connector and a specific function is activated; and an operating circuit operating in a normal mode or a safety mode according to the voltage level of the specific node, wherein:

in response to the function circuit being coupled to the connector:

the function circuit is electrically connected to the first contact terminal, the detection circuit detects the voltage level of the first contact terminal, in response to the voltage level of the first contact terminal not being equal to a first predetermined level, the detection circuit sets the voltage level of the specific node so that the voltage level of the specific node is not equal to the set level, and the operating circuit enters the safety mode to perform a safety operation, in response to the voltage level of the first contact terminal being equal to the first predetermined level, the operating circuit enters the normal mode to stop performing the safety operation.

2. The safety mechanism circuit as claimed in claim 1, wherein the operating circuit comprises:

a power circuit providing power to the connector in the normal mode, wherein the power circuit stops providing power to the connector in the safety mode.

3. The safety mechanism circuit as claimed in claim 2, wherein the operating circuit further comprises:

a micro-controller sending warning information in the safety mode, wherein the micro-controller stops sending the warning information in the normal mode.

4. The safety mechanism circuit as claimed in claim 3, wherein the micro-controller uses an output signal of the function circuit in the normal mode, and stops using the output signal of the function circuit in the safety mode.

5. The safety mechanism circuit as claimed in claim 1, wherein the detection circuit comprises:

a first resistor receiving a first operation voltage;

a first transistor comprising a first gate, a first drain, and a first source, wherein:

the first gate is coupled to the first contact terminal and the first resistor, the first drain is coupled to the specific node, the first source receives a second operation voltage, and the first operation voltage is higher than the second operation voltage.

6. The safety mechanism circuit as claimed in claim 5, wherein in response to the function circuit being coupled to the connector:

the function circuit is electrically connected to a second contact terminal of the connector, the detection circuit detects a voltage level of the second contact terminal, and in response to the voltage level of the second contact terminal not being equal to the first predetermined level, the detection circuit sets the voltage level of the specific node so that the voltage level of the specific node is not equal to the set level.

7. The safety mechanism circuit as claimed in claim 6, wherein the detection circuit further comprises:

a second resistor receiving the first operation voltage; and a second transistor comprising a second gate, a second drain, and a second source, wherein:

the second gate is coupled to the second contact terminal and the second resistor, the second drain is coupled to the specific node, and the second source receives the second operation voltage.

8. The safety mechanism circuit as claimed in claim 7, wherein in response to the function circuit being coupled to the connector:

the function circuit is electrically connected to a third contact terminal of the connector, the detection circuit detects a voltage level of the third contact terminal, in response to the voltage level of the third contact terminal not being equal to a second predetermined level, the detection circuit sets the voltage level of the specific node so that the voltage level of the specific node is not equal to the set level, and the second predetermined level is higher than the first predetermined level.

9. The safety mechanism circuit as claimed in claim 8, wherein the detection circuit further comprises:

a third resistor receiving the first operation voltage;

a third transistor comprising a third gate, a third drain, and a third source, wherein the third gate is coupled to the third resistor, the third drain is coupled to the specific node, and the third source receives the second operation voltage; and a fourth transistor comprising a base, a collector, and an emitter, wherein the base is coupled to the third contact terminal, the collector is coupled to the third gate, and the emitter receives the second operation voltage.

10. The safety mechanism circuit as claimed in claim 9, wherein:

in response to the voltage level of the third contact terminal not being equal to the second predetermined level, the fourth transistor is turned off and the third transistor is turned on, and

in response to the voltage level of the third contact terminal being equal to the second predetermined level, the fourth transistor is turned on and the third transistor is turned off.

11. A motherboard, comprising:
a connector to be coupled to a function circuit and comprising:
a first transmission terminal electrically connected to the function circuit and a first contact terminal;
a second transmission terminal electrically connected to the function circuit and a second contact terminal; and
a plurality of third transmission terminals disposed between the first and second transmission terminals; and
a safety mechanism circuit determining whether a connection between the function circuit and the connector is unstable and comprising:
a detection circuit coupled between the first contact terminal, the second contact terminal and a specific node;
a control circuit setting a voltage level of the specific node so that the voltage level of the specific node is equal to a set level in response to the function circuit being coupled to the connector and a specific function is activated; and
an operating circuit operating in a normal mode or a safety mode according to the voltage level of the specific node,
wherein:
in response to the function circuit being coupled to the connector:
the function circuit is electrically connected to the first and second contact terminals,
the detection circuit detects the voltage level of the first contact terminal and a voltage level of the second contact terminal,
in response to the voltage level of the first or second contact terminal not being equal to a first predetermined level, the detection circuit sets the voltage level of the specific node so that the voltage level of the specific node is not equal to the set level, and the operating circuit performs a safety operation,
in response to the voltage levels of the first and second contact terminals being equal to the first predetermined level, the operating circuit stops performing the safety operation.

12. The motherboard as claimed in claim 11, wherein the function circuit is an advanced driver assistance system (ADAS), an in-vehicle infotainment (IVI) system, or a vehicle control unit (VCU).

13. The motherboard as claimed in claim 12, further comprising:
an in-vehicle Ethernet matching a specific protocol,
wherein the specific protocol is a 100 BASE-TI transmission protocol or a 1000 BASE-TI transmission protocol.

14. The motherboard as claimed in claim 13, wherein the detection circuit comprises:
a first resistor receiving a first operation voltage;
a first transistor comprising a first gate, a first drain, and a first source,
wherein:

the first gate is coupled to the first contact terminal and the first resistor, the first drain is coupled to the specific node, and the first source receives a second operation voltage, and
the first operation voltage is higher than the second operation voltage.

15. The motherboard as claimed in claim 14, wherein in response to the function circuit being coupled to the connector:
the function circuit is electrically connected to a second contact terminal of the connector,
the detection circuit detects a voltage level of the second contact terminal,
in response to the voltage level of the second contact terminal not being equal to the first predetermined level, the detection circuit sets the voltage level of the specific node so that the voltage level of the specific node is not equal to the set level.

16. The motherboard as claimed in claim 15, wherein the detection circuit further comprises:
a second resistor receiving the first operation voltage; and
a second transistor comprising a second gate, a second drain, and a second source,
wherein:
the second gate is coupled to the second contact terminal and the second resistor, the second drain is coupled to the specific node, and the second source receives the second operation voltage.

17. The motherboard as claimed in claim 16, wherein in response to the function circuit being coupled to the connector:
the function circuit is electrically connected to a third contact terminal of the connector,
the detection circuit detects a voltage level of the third contact terminal,
in response to the voltage level of the third contact terminal not being equal to a second predetermined level, the detection circuit sets the voltage level of the specific node so that the voltage level of the specific node is not equal to the set level, and
the second predetermined level is higher than the first predetermined level.

18. The motherboard as claimed in claim 17, wherein the detection circuit further comprises:
a third resistor receiving the first operation voltage;
a third transistor comprising a third gate, a third drain, and a third source, wherein the third gate is coupled to the third resistor, the third drain is coupled to the specific node, and the third source receives the second operation voltage; and
a fourth transistor comprising a base, a collector, and an emitter, wherein the base is coupled to the third contact terminal, the collector is coupled to the third gate, and the emitter receives the second operation voltage.

19. The motherboard as claimed in claim 18, wherein:
in response to the voltage level of the third contact terminal not being equal to the second predetermined level, the fourth transistor is turned off and the third transistor is turned on, and
in response to the voltage level of the third contact terminal being equal to the second predetermined level, the fourth transistor is turned on and the third transistor is turned off.

20. The motherboard as claimed in claim 19, wherein the safety operation is performed to use signals from the function circuit.

* * * * *